United States Patent
Peretz et al.

(10) Patent No.: US 10,064,275 B1
(45) Date of Patent: Aug. 28, 2018

(54) EXTENDING THE LIFETIME OF A LEADLESS SMT SOLDER JOINT USING PADS COMPRISING SPRING-SHAPED TRACES

(71) Applicant: Mellanox Technologies, Ltd., Yokneam (IL)

(72) Inventors: Haim Peretz, Gan Ner (IL); Moshe Shoval, Holon (IL)

(73) Assignee: MELLANOX TECHNOLOGIES, LTD., Yokneam (IL)

( * ) Notice: Subject to any disclaimer, the term of this patent is extended or adjusted under 35 U.S.C. 154(b) by 0 days.

(21) Appl. No.: 15/652,276

(22) Filed: Jul. 18, 2017

(51) Int. Cl.
*H05K 1/09* (2006.01)
*H05K 1/11* (2006.01)
*H05K 3/40* (2006.01)
*H05K 1/02* (2006.01)

(52) U.S. Cl.
CPC .......... *H05K 1/111* (2013.01); *H05K 1/0271* (2013.01); *H05K 1/09* (2013.01); *H05K 3/4007* (2013.01); *H05K 2201/09218* (2013.01); *H05K 2201/10636* (2013.01)

(58) Field of Classification Search
CPC ........ H05K 1/111; H05K 1/0271; H05K 1/09; H05K 3/4007
USPC ........................................ 174/257, 250, 255
See application file for complete search history.

(56) References Cited

U.S. PATENT DOCUMENTS

| | | | |
|---|---|---|---|
| 6,050,832 A | 4/2000 | Lee et al. | |
| 6,092,280 A | 7/2000 | Wojnarowski | |
| 6,298,551 B1 * | 10/2001 | Wojnarowski | H05K 3/3436 257/E23.02 |
| 6,394,819 B1 * | 5/2002 | Mosser, III | H05K 3/3436 257/738 |
| 2003/0008434 A1 | 1/2003 | Dunford | |
| 2005/0164527 A1 | 7/2005 | Radza et al. | |
| 2007/0164450 A1 | 7/2007 | Silverbrook | |
| 2007/0284706 A1 | 12/2007 | Cherian | |
| 2007/0284725 A1 | 12/2007 | Silverbrook | |
| 2014/0268780 A1 | 9/2014 | Wang et al. | |
| 2015/0262919 A1 | 9/2015 | Iran et al. | |

\* cited by examiner

*Primary Examiner* — Tremesha S Willis
(74) *Attorney, Agent, or Firm* — D. Kligler IP Services Ltd.

(57) ABSTRACT

A circuit board includes a substrate and multiple pads. The multiple pads are disposed on the substrate and have respective footprints for connecting one or more electronic components to the circuit board, at least a pad from among the pads includes a linear electrical trace laid out in a two-dimensional (2D) pattern that covers at least a part of a footprint of the pad.

16 Claims, 1 Drawing Sheet

US 10,064,275 B1

EXTENDING THE LIFETIME OF A LEADLESS SMT SOLDER JOINT USING PADS COMPRISING SPRING-SHAPED TRACES

FIELD OF THE INVENTION

The present invention relates generally to design of circuit board pads, and particularly to circuit board pads designed for extending the lifetime of an electronic system.

BACKGROUND OF THE INVENTION

Electronic systems may comprise electronic components mounted on a substrate using various techniques.

For example, U.S. Patent Application Publication 2007/0164450 describes an integrated circuit (IC) carrier assembly that includes a printed circuit board (PCB). A carrier soldered to the PCB. The carrier includes a plurality of electrical contact islands surrounding a receiving zone for receiving an IC. Pairs of adjacent islands are interconnected by respective resilient suspension means. The IC is received in the receiving zone and is electrically coupled to some of the plurality of islands adjacent to the receiving zone.

U.S. Pat. No. 6,394,819, describes a dielectric member interposed between two electrical components which have different coefficients of thermal expansion (CTEs). The dielectric member has conductive traces for electrically connecting the electrical components. The traces may be joined by solder balls to a printed circuit board.

SUMMARY OF THE INVENTION

An embodiment of the present invention that described herein provides a circuit board including a substrate and multiple pads. The multiple pads are disposed on the substrate and have respective footprints for connecting one or more electronic components to the circuit board, at least a pad from among the pads includes a linear electrical trace laid out in a two-dimensional (2D) pattern that covers at least a part of a footprint of the pad.

In some embodiments, the pattern of the electrical trace has a shape selected from a list consisting of a serpentine, a spring, a comb, a spiral, a slotted shape, and a combination thereof. In other embodiments, the pad is configured to be connected to a leadless package selected from a list consisting or a quad flat no-leads (QFN) package, a dual-flat no-leads (DFN) package, and a seam sealing electronic package. In yet other embodiments, the circuit board includes a fusible alloy formed on a surface of the footprint of the pad and configured to mechanically bond and electrically connect between the linear electrical trace and a terminal of one of the one or more electronic components coupled to the fusible alloy.

In an embodiment, the fusible alloy is configured to fill gaps between sections of the 2D pattern of the electrical trace. In another embodiment, the fusible alloy includes solder.

In some embodiments, the electrical trace includes copper. In other embodiments, the 2D pattern is arranged within boundaries of the footprint of the pad.

There is additionally provided, in accordance with an embodiment of the present invention, a method for fabricating a circuit board, the method including providing a substrate. Multiple pads having respective footprints are disposed on the substrate for connecting one or more electronic components to the circuit board, disposing the pads includes forming, in at least a pad from among the pads, disposing a linear electrical trace laid out in a two-dimensional (2D) pattern that covers at least a part of a footprint of the pad.

The present invention will be more fully understood from the following detailed description of the embodiments thereof, taken together with the drawings in which:

DETAILED DESCRIPTION OF EMBODIMENTS

Overview

Figure 1:
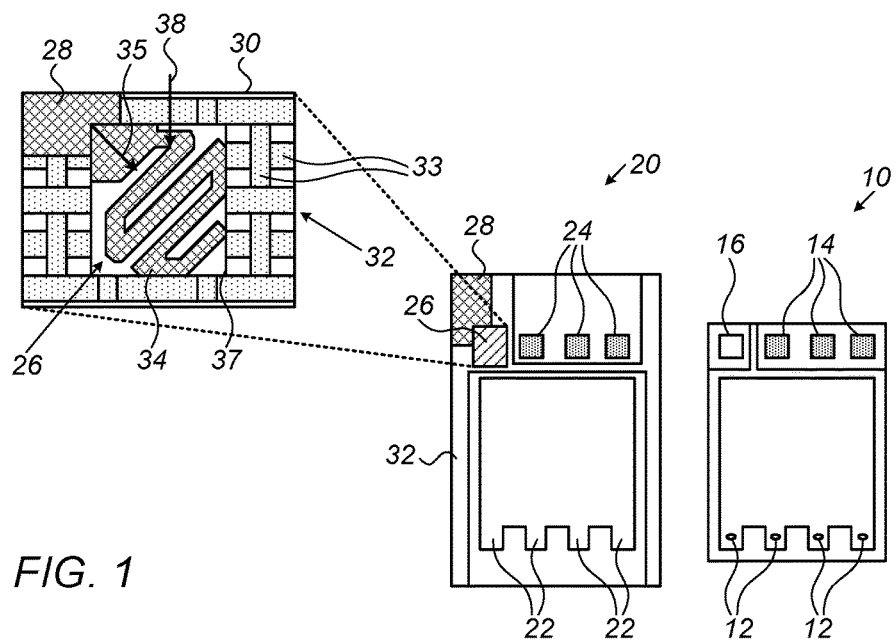
FIG. 1 is a top view of a section of a circuit board (CB) and a bottom view a quad flat no-leads (QFN) package, in accordance with an embodiment of the present invention.

Embodiments of the present invention that are described hereinbelow provide improved circuit board pads and associated methods. The disclosed pad designs improve the endurance of electronic devices, which are mounted on a circuit board using such pads, to thermo-mechanical fatigue.

Electronic systems may be assembled in various techniques, such as surface-mount technology (SMT), in which electronic components, such as a surface-mount device (SMD), are mounted directly on a circuit board (CB) substrate using soldering techniques. In the context of the present disclosure and in the claims, the terms "CB" and "printed circuit boards (PCB)" are used interchangeably.

In the context of the present disclosure, the term "solder," refers to a fusible alloy made from any suitable solder paste, such as SAC305 composition, and the term "solder joint" refers to a stack of elements that comprises a terminal of an electronic device, a solder, and an electrical trace patterned in the PCB.

In some embodiments, some packages of the mounted electronic components may comprise materials having a coefficient of thermal expansion (CTE) substantially different from the CTE of the CB. For example, typical values of CTEs of the CB and a ceramic package mounted thereon, are 45 ppm/° C. and 2 ppm/° C., respectively.

During operation, the electronic system may experience extensive thermal cycling, which is applied as an accelerated testing method for evaluating the lifetime of a device in an electronic system. For example, a device that passes successfully a thousand thermal cycles having a temperature range 0°-100° is expected to have a lifetime of at least six operational years. In such tests, the thermal cycles may result in respective cycles of thermo-mechanical stress, e.g., in the solder disposed between the CB and the package. These stress cycles may cause cracks in a solder joint, resulting in product reliability events and/or a failure of the electronic system. Such effects are referred to herein as thermo-mechanical fatigue.

In some embodiments, the electronic system comprises an electronic component mounted on a PCB. The electronic component may comprise, for example, a quad flat no-leads (QFN) package and a solder joint formed between the PCB and the QFN package. In some embodiments, the PCB may comprise a substrate having multiple pads formed thereon. The pads have respective footprints for connecting one or more terminals of the QFN package to the PCB. In the context of the present disclosure and in the claims, the term "footprint" refers to a bounded patterned area in the PCB (e.g., using a solder mask) assigned for a pad. The solder paste is disposed on the footprint of the pad, and the terminal of the package is mounted thereon.

In some embodiments, at least one of the pads comprises a linear electrical trace laid out in a two-dimensional (2D) pattern, such as a spring or serpentine, which is typically arranged in a planar manner within the boundaries of the footprint area, and covers at least a part of the footprint of the pad, instead of using a conventional rectangular pad. This configuration reduces the effective area of the trace, thereby substantially reducing, the thermo-mechanical stress subjected to the solder joint during thermal cycles.

The combination of operating and environmental temperatures, and large difference of the values of CTE between the PCB and the package terminals, would severely reduce the lifetime expectancy of the electronic system. The disclosed techniques improve this lifetime limitation and enable maintaining the aforementioned configuration by changing the pattern of pads prone to failure due to thermo-mechanical fatigue.

Furthermore, the disclosed techniques may be used to increase the lifetime of the electronic system by reducing thermo-mechanical-related reliability bottlenecks, thereby providing assembly and packaging designers with the flexibility to select materials that will improve electronic specifications of the system.

System Description

FIG. 1 is a top view of a section of a circuit board (CB) 20 and a bottom view of a quad flat no-leads (QFN) package 10 of an electronic component, in accordance with an embodiment of the present invention. In the context of the present disclosure, the term "CB 20" refers to a section of the circuit board on which QFN package 10 is mounted.

In some embodiments, QFN package 10 comprises several terminals, also referred to herein as "legs." The terminals are configured to conduct electrical signals between the electrical component and respective pads of CB 20, via joints made from a fusible alloy, such as a SAC305 solder paste (shown in FIG. 2 below), as will be described herein. In the present context, supply voltage and ground connections are also regarded as electrical signals.

In the example of FIG. 1, package 10 comprises three types of terminals, such as source terminals 12, drain terminals 14, and a single gate terminal 16. Note that the configuration of the terminals may change with a layout of the electronic component packaged therein. An exemplary list of components packaged in a leadless package comprises, but is not limited to, power MOSFET in a QFN package, dual-flat no-leads (DFN) package oscillators, or components using seam sealing packaging technique.

In some embodiments, package 10 is made from ceramic material having a typical coefficient of thermal expansion (CTE) of 2 ppm/° C. In other embodiments, package 10 may be made from other suitable materials, such as polymers, composite materials, or plastic.

In some embodiments, CB 20 comprises a printed circuit board having a substrate 32 comprising any suitable number of layers and types of materials.

In some embodiments, CB 20 comprises one or more pads disposed on substrate 32, also referred to herein as "ground pads." In the example of FIG. 1, CB 20 comprises four pads 22, three pads 24, and a single pad 26. Pads 22 and respective source terminals 12 of QFN package 10 are electrically connected to one another, via a solder shown in FIG. 2 below, and are configured to exchange electrical signals via solder joints shown in FIG. 2 below. Similarly, pads 24 and 26 are coupled to, and configured to exchange electrical signals with, respective drain terminals 14 and gate terminal 16, via respective solder.

In some embodiments, all aforementioned pads are coupled to their respective terminals using solder.

Extending the Lifetime of the Electronic System Using Pads Comprising Spring-Shaped Traces Reliability tests carried out by the inventors, show that leadless surface-mount device (SMD) packages have limited endurance to thermal cycles. For example, after conducting 1000 thermal cycles in the electronic system, the PCB and electronic components were tested by performing cross-sections of multiple terminals soldered to respective pads and subsequently, acquiring images of the cross-sections. The inventors observed cracks and disconnections in the solder joints.

The inventors repeated the tests on samples having revised configurations and process changes in order to improve the endurance of the electronic system to thermal cycle. The revisions comprised, for example, optimization of the soldering reflow process, use of extended volume of the solder pastes, and using different compositions of the solder paste, e.g., reducing the percentage of silver (Ag). Yet, cracks and disconnections still appeared in the solder joints after 1000 thermal cycles.

By analyzing the cracks, the inventors realized that the solder joints cannot withstand oscillating thermo-mechanical stresses caused by large differences between the values of CTE of package 10 (e.g., 2 ppm/° C.) and CB 20 (e.g., 45 ppm/° C.) in thermal cycles having a range of about 100°.

Reference is now made to an inset 30, which depicts a detailed structure of pad 26, in accordance with an embodiment of the present invention. In some embodiments, substrate 32 of CB 20 is typically made from multi-layered epoxy reinforced by pre-impregnated ("prepreg") weave of glass fibers 33.

In example embodiments, pad 26 comprises a 5 mil wide, 180 mil long linear electrical trace 34, laid out in a two-dimensional (2D) spring pattern having any suitable number of segments (e.g., eight segments). The spring pattern covers part of the typically rectangular footprint of pad 26, and electrically connected to an electrical trace 28 of CB 20.

In alternative embodiments, the pattern of trace 34 may have any suitable shape, such as a serpentine, a spring, a comb, a spiral, a slotted shape, or any combination of the above shapes.

In some embodiments, an arrow 35 that represents the longitudinal axis of trace 34 (e.g., towards a corner 37 of pad 26) is oriented at 45° relative to the orientation of fibers 33. Note that the size, shape and orientation of trace 34 are depicted purely by way of example, and in other embodiments, in any other suitable arrangement of trace 34 may be applied.

In the example of FIG. 1, pad 26 is the sole conductor of electrical signals between gate terminal 16 and CB 20, whereas pads 22 and 24 have redundancy for conducting respective electrical signals, e.g., in case one of these respective pads does not function. In this configuration, pad 26 might be the first to fail in thermal cycles, due to thermo-mechanical fatigue. Therefore, in this embodiment, pads 22 and 24 have a solid rectangular shape, and the 2D patterned trace is implemented only in pad 26. In alternative embodiments, the 2D patterned trace may be implemented in any additional or alternative pads of CB 20, as well as in any other configurations of pads, e.g., in other electronic systems.

Figure 2:
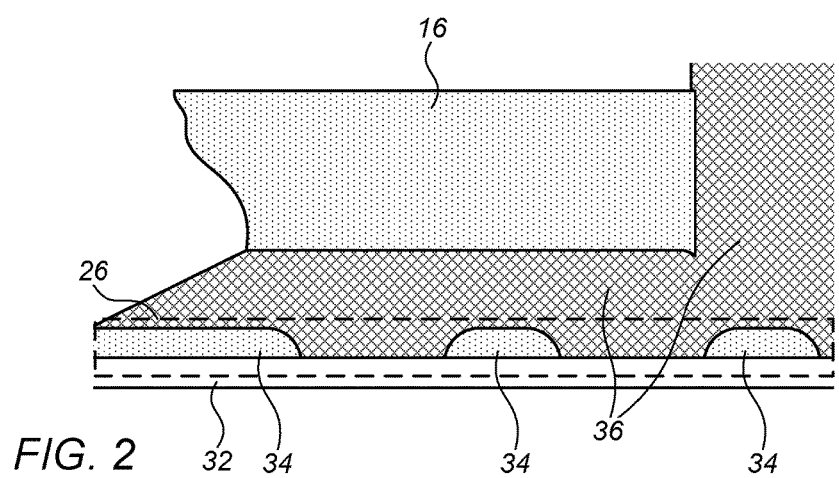
FIG. 2 is a sectional side view of a QFN package soldered to a section of a CB, in accordance with an embodiment of the present invention.

FIG. 2 is a sectional side view of gate terminal 16 of QFN package 10, soldered to pad 26 of CB 20, in accordance with an embodiment of the present invention. In the example of FIG. 2, the cross section is in a direction of an arrow 38, crossing through the center of pad 26.

In some embodiments, pad 26 is represented by a dashed rectangle comprising trace 34 and a top surface of substrate 32 of CB 20.

In some embodiments, a solder 36 is disposed on the footprint of pad 26, between pad 26 and gate terminal 16. In the example of FIG. 2, the solder joint comprises gate terminal 16, solder 36 and electrical trace 34. In this configuration, solder 36 mechanically bonds and electrically connects gate terminal 16 to trace 34 (shown in FIG. 2 as sections of trace 34.) Note that the design of pad 26 enables solder 36 to fill gaps between the sections of trace 34, even though solder 36 is adjacent to but not mechanically bonded to substrate 32.

In this configuration, the effective contact surface between trace 34 and solder 36 is substantially reduced. The inventors found that this configuration reduces the level of thermo-mechanical stresses between pad 26 and terminal 16, thereby enabling about 2000 thermal cycles (which may indicate further increase in the lifetime of the electronic system) at the conditions described in FIG. 1 above, before appearance of cracks in the solder joint.

In other embodiments, package 20 may be made of plastic, or other suitable materials, and solder 36 may comprise any suitable metallic or non-metallic fusible alloys, such as alloys of electrically conductive thermoplastic polymers, or composite-materials.

Although the embodiments described herein mainly address assembly of leadless SMT components, the methods and systems described herein can also be used in other applications, such as in any device that comprises elements having different respective CTE values that are coupled to one another.

It will thus be appreciated that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. A circuit board, comprising:
   a substrate; and
   multiple pads, which are disposed on the substrate and have respective footprints for connecting one or more electronic components to the circuit board,
   wherein at least a pad from among the pads comprises a linear electrical trace laid out in a two-dimensional (2D) planar pattern that covers at least a part of a footprint of the pad,
   wherein the linear electrical trace of the pad comprises multiple segments separated by gaps,
   and wherein, even though both the segments and the gaps are coupled to receive a fusible alloy disposed across the footprint of the pad, a thermo-mechanical contact area between the fusible alloy and the pad comprises only the segments and not the gaps.

2. The circuit board according to claim 1, wherein the 2D planar pattern of the electrical trace has a shape selected from a list consisting of a serpentine, a spring, a comb, a spiral, a slotted shape, and a combination thereof.

3. The circuit board according to claim 1, wherein the pad is configured to be connected to a leadless package selected from a list consisting of a quad flat no-leads (QFN) package, a dual-flat no-leads (DFN) package, and a seam sealing electronic package.

4. The circuit board according to claim 1, wherein the fusible alloy is formed on a surface of the footprint of the pad and mechanically bonds and electrically connects between the linear electrical trace and a terminal of one of the one or more electronic components coupled to the fusible alloy.

5. The circuit board according to claim 4, wherein the fusible alloy fills the gaps between the segments of the 2D planar pattern of the electrical trace.

6. The circuit board according to claim 4, wherein the fusible alloy comprises solder.

7. The circuit board according to claim 1, wherein the electrical trace comprises copper.

8. The circuit board according to claim 1, wherein the entire 2D planar pattern, including all the segments, is arranged within boundaries of the footprint of the pad.

9. A method for fabricating a circuit board, the method comprising:
   providing a substrate; and
   disposing on the substrate multiple pads having respective footprints for connecting one or more electronic components to the circuit board,
   wherein disposing the pads comprises forming, in at least a pad from among the pads, a linear electrical trace laid out in a two-dimensional (2D) planar pattern that covers at least a part of a footprint of the pad,
   wherein forming the linear electrical trace comprises forming multiple segments separated by gaps,
   and wherein, even though both the segments and the gaps are coupled to receive a fusible alloy disposed across the footprint of the pad, a thermo-mechanical contact area between the fusible alloy and the pad comprises only the segments and not the gaps.

10. The method according to claim 9, wherein forming the linear electrical trace comprises patterning the electrical trace to a shape selected from a list consisting of a serpentine, a spring, a comb, a spiral, a slotted shape, and a combination thereof.

11. The method according to claim 9, wherein the pad is configured to be connected to a leadless package selected from a list consisting of a quad flat no-leads (QFN) package, a dual-flat no-leads (DFN) package, and a seam sealing electronic package.

12. The method according to claim 9, wherein the fusible alloy is mechanically bonding and electrically connecting between the linear electrical trace and a terminal of one of the one or more electronic components coupled to the fusible alloy.

13. The method according to claim 12, wherein the fusible alloy fills the gaps between the segments of the 2D planar pattern of the electrical trace.

14. The method according to claim 12, wherein the fusible alloy comprises solder.

15. The method according to claim 9, wherein the electrical trace comprises copper.

16. The method according to claim 9, wherein disposing the linear electrical trace comprises arranging the entire 2D planar pattern, including all the segments, within boundaries of the footprint of the pad.

* * * * *